(12) United States Patent
Lu

(10) Patent No.: US 7,629,787 B2
(45) Date of Patent: Dec. 8, 2009

(54) CURRENT SENSOR HAVING SHUNT RESISTOR AND CLAMPER DIODE FOR MOTOR CONTROL

(76) Inventor: Qixiang Lu, 2480 Mossy Creek Dr., Owatonna, MN (US) 55060

( * ) Notice: Subject to any disclaimer, the term of this patent is extended or adjusted under 35 U.S.C. 154(b) by 256 days.

(21) Appl. No.: 11/619,456

(22) Filed: Jan. 3, 2007

(65) Prior Publication Data

US 2008/0157752 A1 Jul. 3, 2008

(51) Int. Cl.
  *G01R 19/00* (2006.01)
  *G01F 1/10* (2006.01)
(52) U.S. Cl. .................................................. 324/158.1
(58) Field of Classification Search ........................ None
  See application file for complete search history.

(56) References Cited

U.S. PATENT DOCUMENTS

| | | | |
|---|---|---|---|
| 5,278,748 A * | 1/1994 | Kitajima | 363/21.02 |
| 5,488,324 A * | 1/1996 | Mizuta et al. | 327/77 |
| 5,798,624 A | 8/1998 | Wilke et al. | |
| 6,262,544 B1 | 7/2001 | Disser et al. | |
| 6,274,999 B1 | 8/2001 | Fujii et al. | |
| 6,388,416 B1 | 5/2002 | Nakatani et al. | |
| 6,998,800 B2 | 2/2006 | Fulton | |
| 7,112,935 B2 * | 9/2006 | Fujino et al. | 318/433 |
| 7,132,808 B1 | 11/2006 | Thexton et al. | |
| 2003/0090241 A1 | 5/2003 | Nakatsu et al. | |
| 2006/0038523 A1 | 2/2006 | Fujino et al. | |

FOREIGN PATENT DOCUMENTS

| | | |
|---|---|---|
| EP | 0649206 | 9/1993 |
| EP | 0365216 | 3/1994 |
| EP | 0808010 | 11/1997 |
| EP | 1280264 | 1/2003 |
| EP | 1432107 | 6/2004 |
| WO | WO 8912361 A1 * | 12/1989 |
| WO | WO 98/09176 | 3/1998 |

\* cited by examiner

*Primary Examiner*—Paresh Patel
(74) *Attorney, Agent, or Firm*—Larkin Hoffman Daly & Lindgren Ltd; Craig J. Lervick, Esq.

(57) ABSTRACT

The present invention provides an improved motor current sensor and methods thereof. A first embodiment of the present invention provides a circuit having a signal transfer unit for receiving first and second input signals from opposing terminals of a shunt resistor and a signal conditioner unit for conditioning output signals from the signal transfer unit for a low power control unit. A second embodiment of the present invention provides a circuit having a signal conditioner unit for receiving first and second input signals from opposing terminals of a shunt resistor and delivering output signals to a signal transfer unit and finally to a level shifter for providing first and second voltage signals to a control unit.

16 Claims, 4 Drawing Sheets

A new signal transfer scheme

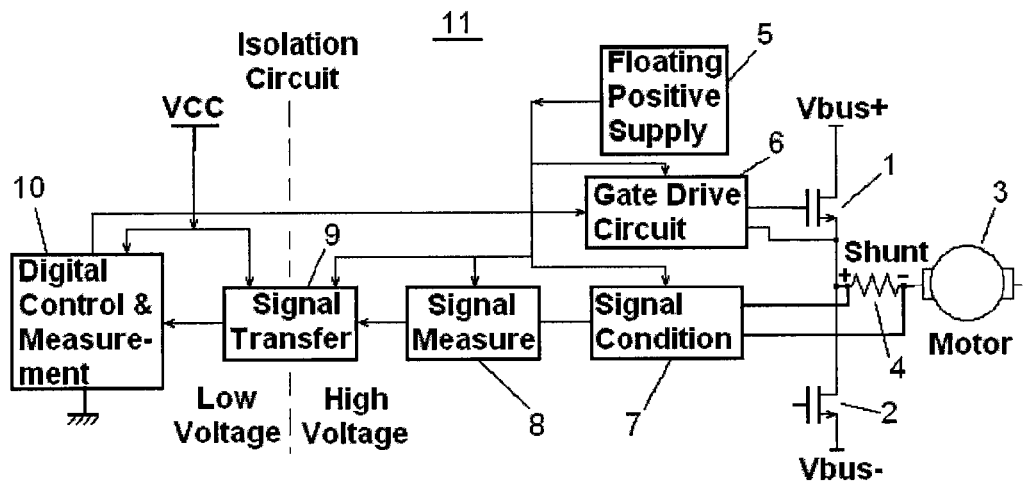
Fig.1 Existing Current Sensor Scheme
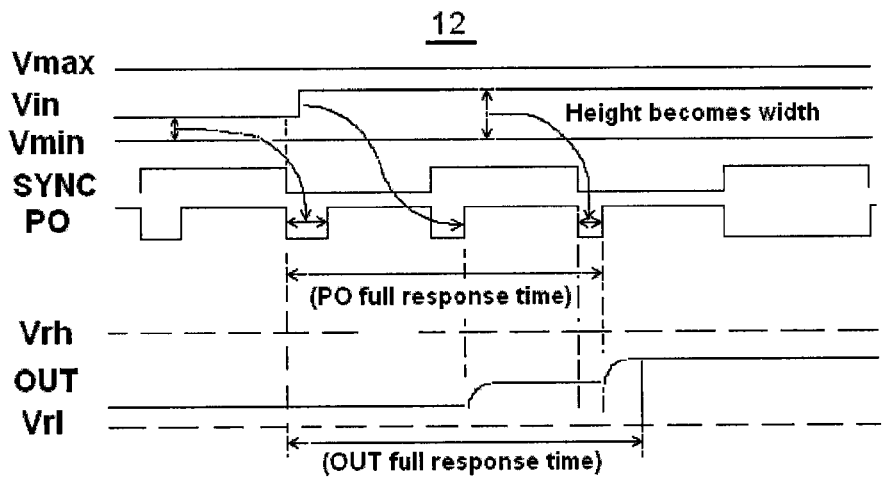
Fig. 2 PWM Transferring Timing Diagram

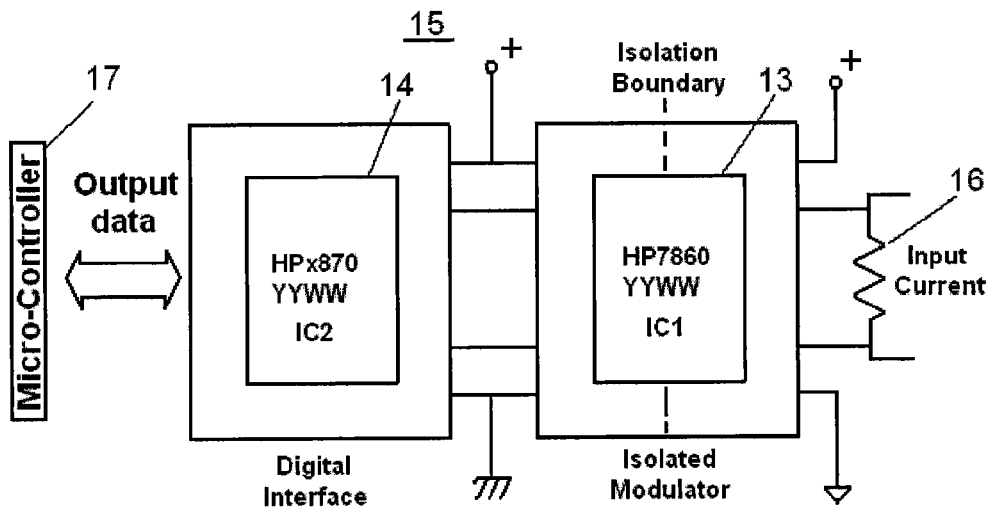
Fig. 3 HP7860 Digital Current Sensor
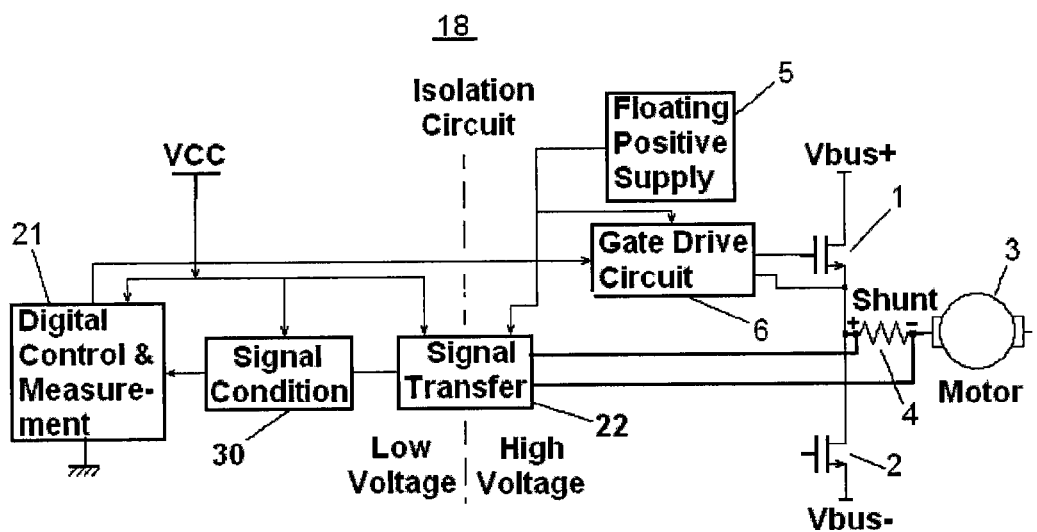
Fig. 4 A new Current Sensor Scheme

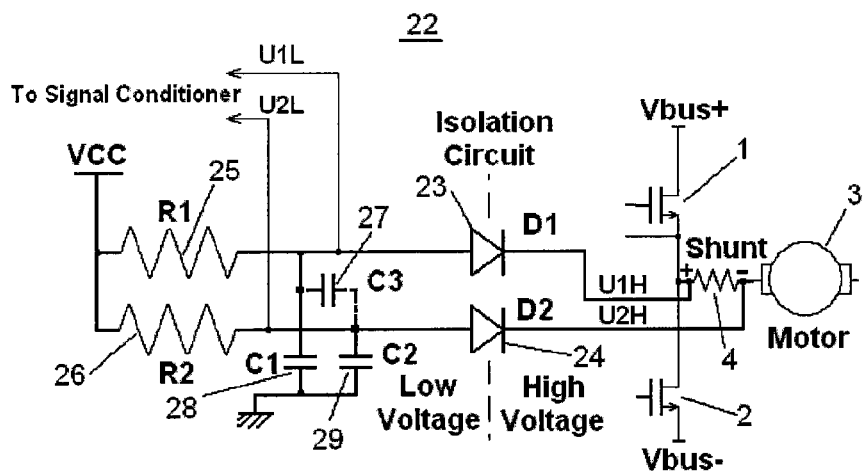
Fig. 5 A new signal transfer scheme
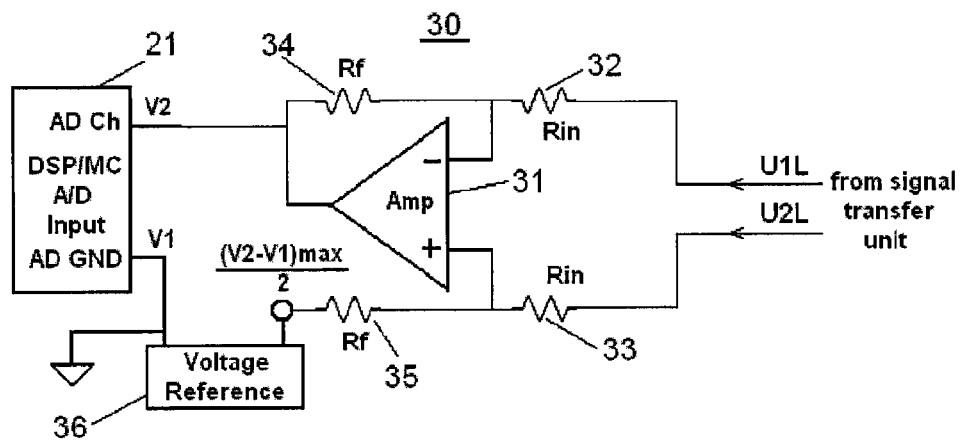
Fig. 6 a differential amplifier as signal conditioner
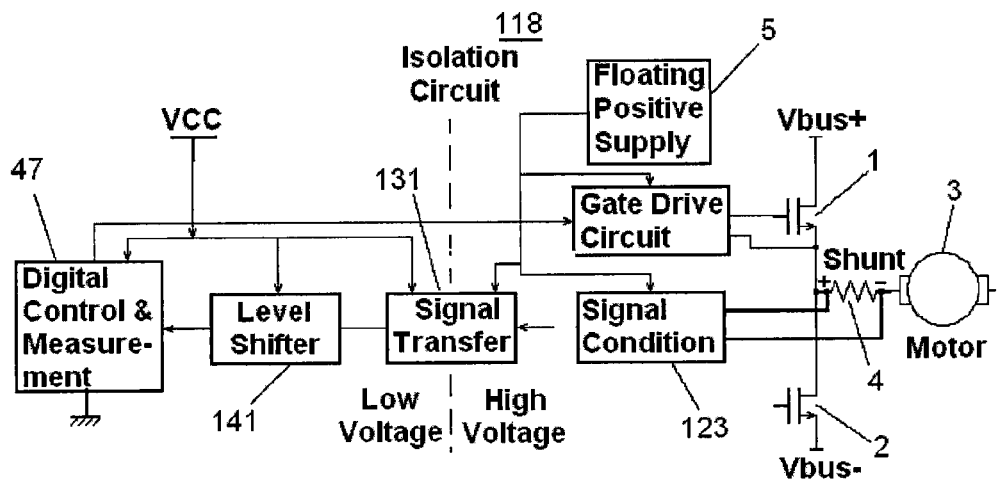
Fig. 7 A new Current Sensor Scheme

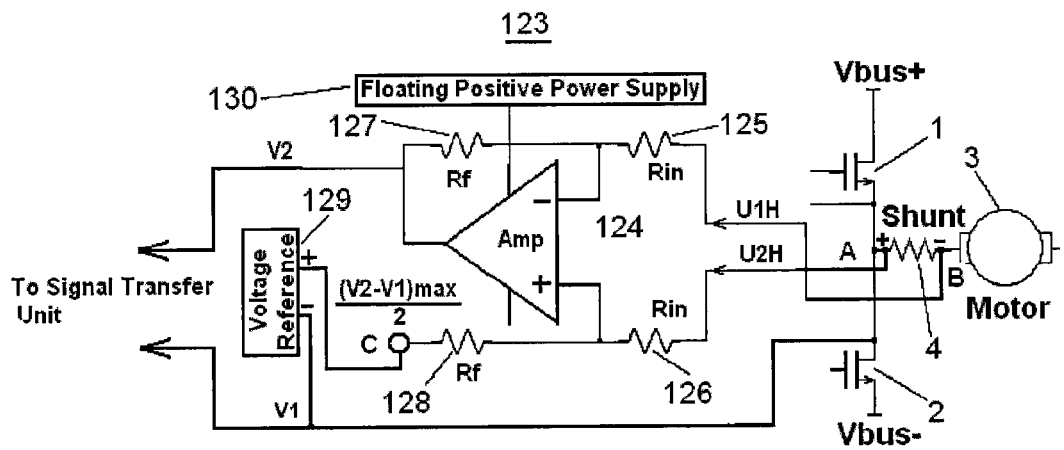
Fig. 8 Shunt amplifier/Signal Conditioner Scheme
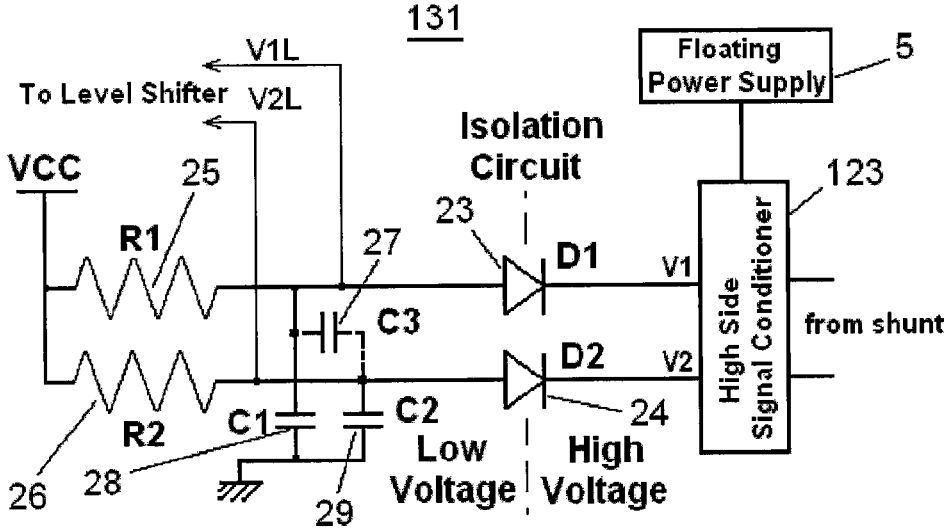
Fig. 9 Signal Transfer Unit
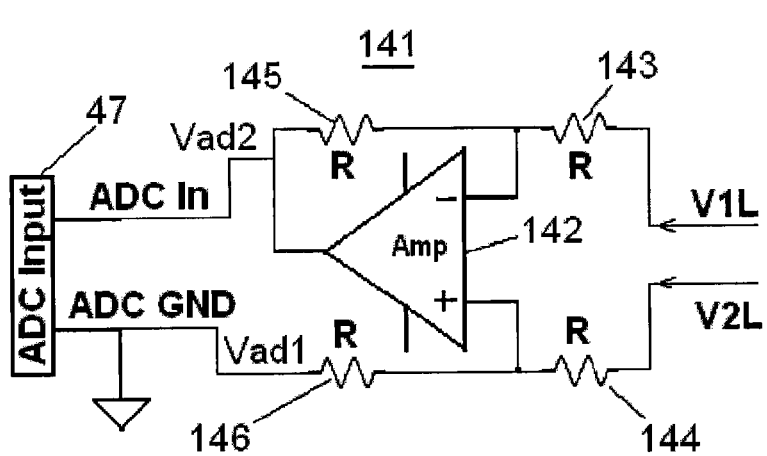
Fig. 10 Voltage Level shifter

CURRENT SENSOR HAVING SHUNT RESISTOR AND CLAMPER DIODE FOR MOTOR CONTROL

BACKGROUND OF THE INVENTION

1. Field of the Invention

The present invention relates generally to the field of current sensors and methods for motor control. More specifically, the present invention relates to an improved current sensor and current sensor components for motor control.

2. Background of the Prior Art

In the field of motor control circuitry, there is always a system performance related issue of how to get motor phase current information accurately and instantly to the motor control unit.

The motor control unit is generally a low power circuitry configuration comprising a digital signal processor and/or microcontroller. In contrast, the motor phase currents are generated by a high voltage switching mode power supply. Such voltages are too high to be connected directly to the motor control unit, otherwise such voltages would cause damage to the low power circuitry of the motor control unit. As a result, various current sensors have been developed in the prior art to isolate high voltage switching mode power supply from the motor control unit while transferring the high side motor phase current information to the motor control unit at low voltage DC power supply.

One such prior art sensor control circuit is illustrated in FIG. 1, wherein the current sensor 11 is shown for one of the normally three or more phases of the motor. A high voltage power supply is connected to switching components 1 and 2 with its terminals Vbus+ and Vbus−, respectively, as shown in FIG. 1. Both switching components 1 and 2 can be turned on or off depending on the motor control algorithms. However, switching components 1 and 2 may never be on at the same time.

Turning now to the operation of this prior art current sensor, a signal conditioner 7, powered by a floating positive supply 5, is connected directly to a shunt resistor 4 whereas the current coming from switch components 1 or 2 flows through shunt resistor 4 to the motor 3. Measurement unit 8 measures the output signal of signal conditioner 7. Because the measurement unit 8 is in high side too, the low side motor control unit 10 can not receive output from measurement unit 8 directly.

To solve above problem, an isolator 9 is introduced. We also call it signal transfer unit 9 because it does both isolation and signal transferring work in one. After signal transfer unit 9, the output voltage or data from isolator 9 can be accepted by motor control unit 10.

An existing example circuit like that shown in FIG. 1 is the IR2277S/IR2177S IC circuit from International Rectifier located at 233 Kansas Street, El Segundo, Calif. 90245. The timing diagram 12 of transferring signal in this way is shown in FIG. 2.

The parameters of FIG. 2 are as follows:
- Vmax: Maximum input voltage before input saturation (around +250 mV)
- Vmin: Minimum input voltage before input saturation in reverse direction (around −250 mV)
- Vin: Actual input voltage coming from shunt resistor
- Sync: Low side input synchronization signal from control unit
- PO: PWM Output pulse signal
- Vrh: OUT Reference High Voltage
- Vrl: OUT Reference Low Voltage
- OUT: Analog Output Voltage As shown in FIGS. 1 and 2, the current measurement is performed on the high side in this circuit. The output is a low side pulse-width modulated (PWM) signal that represents the shunt current level. One disadvantage of this prior art circuit is that the working frequency is limited to maximum of 20 kHz. Another disadvantage is that it needs an external synchronous signal from control unit 10 that must be at most equal to or lower than switching frequency (20 KHz). When the shunt current changes to a new value, it also needs two synchronous cycles to stabilize the new output.

The disadvantages of this prior art system is the complexity and low speed of the current sensor 11. Whereas motor control units already exist that are capable of measuring current from a low power input signal, it would be advantageous to provide an improved current sensor that eliminates the signal measurement component 8 as required by this prior art circuit 11.

Another existing example of a prior art motor current sensor utilizes isolated digital communication as shown in FIG. 3. An example of this prior art device is the HCPL-7860 from Hewlett Packard at 3000 Hanover Street, Palo Alto, Calif. 94304-1185 USA . The circuit 15 carries out three tasks, signal conditioning, signal measurement and signal transfer in one isolated modulator IC 13 which converts shunt voltage input 16 into digital data and sends out data serially synchronized by its clock output (10 MHz typical) pin. The data signal from the isolated modulator 13 can not be accepted by a normal digital control unit 17, so a second digital interface IC 14 is needed, dedicated to digital communication between isolated modulator 13 and digital control unit 17.

Each shunt channel 16 needs one digital interface 14. The overall cost and circuit complexity are thus increased due to more digital interfaces 14 needed for multi channel shunts in multiphase motor control.

Another disadvantage of this prior art circuitry is its resolution/speed trade-off. An 18 us time delay occurs when 12 bit resolution is transferred, and a 94 us signal time delay occurs for 14 bit resolution transformation. These time delays compromise too much performance in, e.g., 20 khz switching frequency motor control.

At least in view of the above, it would be desirable to reduce the complexity of the circuitry between shunt resistor 16 and digital control unit 17 while maintaining accuracy at high switching frequency. It would also be advantageous to increase the circuit reliability with less signal delay time than this prior art circuit.

It is an objective of the present invention to overcome these and additional disadvantages of the prior art current sensors for motor control and to provide additional improvements which shall become apparent in the summary, drawings and detailed description of the present invention.

SUMMARY OF THE INVENTION

The present invention provides an improved current sensor and method for motor control. In a first embodiment of the present invention a current sensor comprises a signal transfer unit for receiving a first and a second high voltage signal as inputs and providing a corresponding first and second low voltage signal as output corresponding to a difference between the high voltage inputs. The high voltage signals are received from opposing terminals of a shunt resistor, wherein the shunt resistor is connected to a first and second high voltage switch component at one terminal and to the motor at the opposite terminal.

The current sensor further comprises a signal conditioner wherein the low voltage output of the signal transfer unit is received as input. The signal conditioner provides a first output voltage that is in proportion to the current passing through the shunt resistor and a second output that provides a reference voltage. Both outputs from the signal conditioner are within the low voltage range wherein they may be connected to a control unit and the motor current can be measured therefrom by the control unit.

In an alternative embodiment of the present invention, a current sensor comprises a signal conditioner unit for receiving a first and second high voltage signal as input from a shunt resistor connected to a motor. The signal conditioner provides a first high voltage as an output proportionate to the difference between the first and second high voltage signal inputs, plus an output of a reference voltage.

The output from the signal conditioner is provided to a signal transfer unit which converts first and second high voltage signals to first and second low voltage signals as outputs. Finally, a voltage level shifter unit receives first and second low voltage signal outputs from the signal transfer unit and shifts first and second signals to a first output voltage that is in proportion to the current passing through the shunt resistor and a second output that provides a reference voltage. Both outputs from the voltage level shifter unit are within the low voltage range wherein they may be connected to a control unit and the motor current can be measured therefrom by the control unit.

BRIEF DESCRIPTION OF THE DRAWINGS

FIG. 1 is a block diagram of a prior art current sensor circuit.

FIG. 2 is a pulse width modulation graph of the prior art circuit from FIG. 1.

FIG. 3 is a prior art digital current sensor.

FIG. 4 is a block diagram of a first embodiment of a current sensor in accordance with the present invention.

FIG. 5 is a signal transfer unit in accordance with the present invention.

FIG. 6 is a signal conditioner in accordance with the present invention.

FIG. 7 is a block diagram of an alternative embodiment of a current sensor in accordance with the present invention.

FIG. 8 is a signal conditioner in accordance with an alternative embodiment of the present invention.

FIG. 9 is a signal transfer unit in accordance with an alternative embodiment of the present invention.

FIG. 10 is a voltage level shifter in accordance with an alternative embodiment of the present invention.

DETAILED DESCRIPTION OF THE PREFERRED EMBODIMENTS

FIGS. 4 and 7 illustrate block diagrams of improved current sensor units in accordance with the present invention.

As shown, a motor 3 is provided having an appropriate shunt resistor 4 connected thereto at a first terminal. A high voltage power supply is connected to an opposing second terminal of the shunt resistor 4 by a pair of switch components 1 or 2 having values Vbus+ and Vbus−, respectively, whereby the current coming from switch components 1 or 2 flows through shunt resistor 4 to motor 3. It is understood that switch components 1 and 2 can be turned on or off depending on motor control algorithms from a control circuit 21. However, switch components 1 and 2 can not be both on at the same time.

It is further understood that by way of example the embodiments of the present invention are configured in a position near the low motor bus, Vbus− at switching component 2, whereas the present invention may be readily configured to work at reverse polarity near the high motor bus, Vbus+, by reversing the relevant components, such being well known to one of ordinary skill in the art without requiring substantial changes to the structure and/or methods of the present invention.

It is also understood that motor 3 may operate in a plurality of phases and that any number of current sensor units of the present invention may be connected to the motor 3 so as to measure the current of the motor 3 in any one or more of the plurality of phases of operation of the motor 3 as is commonly known in the art.

Turning now to FIGS. 4-6, a first current sensor unit 18 is provided having a signal transfer unit 22 and a signal conditioner unit 30. The first current sensor unit 18 is connected to opposing terminals of the shunt resistor 4 for receiving input voltages, U1H and U2H, therefrom and is coupled to a control unit 21 for providing an output, V1 and V2, thereto.

The voltage signal from switching components 1 or 2 are thus delivered as inputs, U1H and U2H, to the signal transfer unit 22 of the first current sensor unit 18. The signal transfer unit 22 thereby provides outputs U1L and U2L to signal conditioner 30 which are of a lower magnitude voltage than U1H and U2H. The signal conditioner 30 provides output signals V1 and V2 to the control unit 21 which is programmed to measure a corresponding motor phase current based upon the output signals V1 and V2.

Turning now to FIG. 5, the signal transfer unit 22 is directly connected to the phase current circuit of the multi-phase motor 3 via the opposing terminals of the shunt resistor 4. The corresponding inputs U1H and U2H are each coupled to one of a corresponding special signal isolation diode pair 23 and 24 referred to hereinafter as twin-clamper diodes 23, 24. In the present embodiment the twin-clamper diodes 23, 24 have equal parameters and are therefore identical.

The signal transfer unit 22 is connected to a direct current power supply, VCC wherein the voltage level of the direct current power supply is low enough to be within the maximum ratings of the signal conditioner unit 30. Additionally, the voltage level of VCC must be high enough to make twin-clamper diodes 23, 24 clamp when switching component 2 is turned on and saturated.

In the present embodiment, the voltage level of VCC should therefore be several volts higher than the saturation volts of the switching component 2 and the negative terminals of the twin-clamper diodes 23, 24 are connected to the two ends of the shunt resistor 4.

As shown, one or more capacitors 27, 28, 29 are provided whereby when switching component 2 is on the voltages U1L and U2L on the positive side of twin-clamper diodes 23, 24 are clamped to (almost equal to) negative side voltages U1H and U2H, respectively, and held by capacitors 27, 28, 29. The current information (U1H−U2H) is thus transferred from shunt resistor 4 to positive side of twin-clamper diodes 23, 24 (U1L−U2L) and held on capacitors 27, 28, 29.

It is understood that either a single capacitor 27 or two capacitors 28, 29 are enough to hold the charged voltage. There are three positions for holding capacitors 27, 28, 29 depending upon the delay and/or for holding the amount of time desired for holding the information. Additionally, if the motor control algorithm of the control unit 21 makes analog/digital sampling moment within the clamping moment, the signal transfer unit 22 may operate fine with weak need for capacitors. Here "weak need" is a need of small capacitance value of 28, 29 for only suppressing transient noises on U1L, U2L that comes through parasitic capacitance of damper diodes from high side switching voltage U1H, U2H. In other cases, such as analog/digital converters that sample in the time when switching component 1 is on and 2 is off, one or more capacitors 27, 28, 29 should be present to hold (U1L–U2L) long enough for sampling to come. While switching component 1 is on, voltages on both sides of shunt resistor 4 is high, approaching Vbus+, twin-clamper diodes 23, 24 are shut off due to reverse voltage drops, but high voltage signals U1H and U2H at this moment are isolated by twin-clamper diodes 23, 24.

It is preferable that the maximum reverse stand voltage of the twin-clamper diodes 23, 24 are higher than the switching power supply voltage of the motor, surge and transient voltages in the circuits.

In a preferred embodiment of the present invention, the parameters of resistors 25 and 26 through which the voltage from VCC must pass to the twin damper diodes 23, 24 are identical.

In another preferred embodiment of the present invention the parameters of the capacitors 28, 29 are identical.

In another preferred embodiment of the present invention the time constants formed by any combination between resistors 25, 26 and capacitors 27, 28, 29 are smaller than a motor electrical time constant. The time constants of the resistors and capacitors can be set depending on the sampling algorithm of the control unit 21. Generally we have $$R1 * C1 = R2 * C2 > \frac{T_{hold}}{5}$$

$T_{hold}$ is the time interval that voltage drop (U2L–U1L) on capacitors can be held within 1% accuracy. AD sampling time should come before the end of this time interval. Any two of three capacitors C1, C2, C3 are enough to maintain the function, if long $T_{hold}$ is needed.

As shown in FIG. 6 a signal conditioner unit 30 is provided to linearly amplify current signal (U1L–U2L) from output of signal transfer unit 22 to have its output (to) fit the A/D converter input range of control circuit 21.

A differential amplifier 31 is provided in signal conditioner unit 30. The gain of the differential amplifier 31 is set such that the requirement mentioned later is satisfied, that is, $$\text{Gain} = \frac{R_f}{R_{in}} = \frac{(V_2 - V_1)_{max}}{2 * (U2L - U1L)_{max}}$$

Where, V2 is the Analog input voltage of AD converter of dsp or mc.

V1 is the Analog voltage reference Ground for AD converter input of the control unit 21.

$(V_2-V_1)_{max}$ is AD converter input range of control unit 21.

$(U2L-U1L)_{max}$ is the maximum output of signal transfer unit 22, corresponding to maximum shunt resistor 4 voltage difference output.

A voltage reference unit 36 is provided, such that when the output current signal of shunt resistor 4 is bi-polar, the AD convertor of the control unit 21 having a single polar input range still gets full range linear transformation. The output of voltage reference unit 36 is, therefore:

$$\frac{(V_2 - V_1)_{max}}{2}$$

so that when the input of signal conditioner 30 is as follows:

If (U1L–U2L)=0, we have $$(V2 - V1) = \frac{(V_2 - V_1)_{max}}{2}.$$

Such that for any (U2L–U1L) values as outputs from the signal transfer unit 22 and inputs to the signal conditioner unit 30, the following describes the output of the signal conditioner unit 30 to the control unit 21:

$$V_2 - V_1 = (U2L - U1L) * \text{Gain} + \frac{(V_2 - V_1)_{max}}{2}$$

With the gain inserted, the output becomes:

$$V_2 - V_1 = (U2L - U1L) * \frac{Rf}{Rin} + \frac{(V_2 - V_1)_{max}}{2}$$

Thereby, the output of the current sensor unit 18 is received by control unit 21 in the form of low power voltage signals that can be easily converted to a current measurement by the control unit 21 for use in control of the motor 3.

Turning now to FIGS. 7-10, an alternative embodiment of an improved motor current sensor is provided in accordance with the present invention.

FIG. 7 provides a block diagram of the present embodiment of the current sensor 118 comprising a signal conditioner unit 123, a signal transfer unit 131 and a level shifter unit 141.

As shown in more detail in FIG. 8, the signal conditioner unit 123 receives inputs from opposing terminals of a shunt resistor 4 wherein a first terminal of the shunt resistor 4 is connected to switch components 1 and 2 as described previously with reference to FIG. 4. Thus, signal conditioner unit receives as inputs U1H and U2H, respectively. The variables shown in FIG. 8 are defined as follows:

U1H & U2H: Voltages on two terminals of shunt resistor 4
V2: Amplifier 124 output
V1: Amplifier output reference point connected to top of switching component 2;
(V2–V1): Output of signal conditioner unit 123;
$(V2-V1)_{max}$: Maximum output range of signal conditioner unit 123.

The signal conditioner unit 123 provides outputs V1 and V2 wherein V2 relates to the proportion of the voltage signals from the first and second terminals, U1H and U2H, of the shunt resistor 4 and V1 relates to a reference voltage.

The signal conditioner unit 123 further comprises a shunt amplifier 124 connected to a floating power supply 130 wherein the shunt amplifier 124 functions to linearly amplify current information from the shunt resistor 4. Only resistors, Rf and Rin, are used in the feedback and input portions of the amplifier 124 in order to keep fast response ability of the current sensor unit 118 while reducing cost. The input resistors, Rin, are connected to each terminal of the shunt resistor in the current path to the motor.

A voltage reference unit 129 is provided to change a bi-polar input from first and second terminals of the shunt resistor 4 to uni-polar output of signal conditioner unit 123. Voltage reference unit 129 has a reference voltage output selected to be half of maximum output of the signal conditioner unit 123, i.e., $$\frac{(V_2 - V_1)_{max}}{2}$$

Voltage reference unit 129 could alternatively be moved into voltage level shifter unit 141 in order to accomplish the same objective.

Accordingly, the value of feedback resistor 127 and 128 are equal to Rf. The value of input resistor 125 and 126 are equal to Rin. Suppose the input range of AD converter is (V2–V1) max, the output of amplifier is then described as follows:

$$V_2 - V_1 = (U_{2H} - U_{1H}) * \frac{R_f}{R_{in}} + \text{Voltage Reference}$$
$$= (U_{2H} - U_{1H}) * \frac{R_f}{R_{in}} + \frac{(V_2 - V_1)_{max}}{2}$$

The gain is set according to the following equation:

$$\text{Gain} = \frac{R_f}{R_{in}} = \frac{(V_2 - V_1) \text{max}}{2 * (U_{2H} - U_{1H}) \text{max}}$$

For example, $(U_{2h}-U_{1h})_{max}$=0.2V, $(V_2-V_1)_{max}$=3V, $R_{in}$=1.00k, then we have $$R_f = R_{in} * \text{Gain} = R_{in} * \frac{(V_2 - V_1)_{max}}{2*(U_{2h}-U_{1h})_{max}} = 1.00\,k * \frac{3.0V}{2*0.2V} = 7.5\,k$$

Turning now to FIG. 8, the output V2–V1 from the signal conditioner unit 123 is provided as input to the signal transfer unit 131. As can be seen the structure of the signal transfer unit 131 is the same as that of the signal transfer unit 22 discussed with reference to FIG. 5. It is understood that the structure and operation of the signal transfer unit 131 may be modified as discussed with reference to the signal transfer unit 22 from FIG. 5. Returning now to the embodiment of FIG. 8, the signal conditioner unit 123 thereby provides an output V1 and V2, as shown.

Turning now to FIG. 9, the output U1L and U2L from signal transfer unit 131 is provided to voltage level shifter unit 141. The voltage level shifter unit 141 then provides outputs Vad2 and Vad1 to the control unit 47. When U1L follows minimum output of signal conditioner unit 123, i.e., V1min, it is actually locked to saturation voltage drop on switching component 2, which has a non-zero voltage. The input reference point of the control unit 47 is usually some fixed value, for example, 0 Volts relative to ADC GND. The voltage level shifter 141 makes any V1 caused by saturation voltage of the switching component 2 shift to ADC GND or whatever the reference point may be.

A differential amplifier 142 is provided in voltage level shifter 141. In a preferred embodiment, all input resistors 143, 144 and feedback resistors 145, 146 have a same value, R. So where the gain of the amplifier 142 is one. We have $$(Vad2-Vad1)=(U2L-U1L)$$

According to another embodiment of present invention, the output reference point Vad1 is directly connected to the ground reference input of the control unit 47. Thereby, the output of the current sensor 118 is received by control unit 47 in the form of low power voltage signals that can be easily converted to a digital current data value by the control unit 47 for use in control of motor 3.

The following examples are illustrative and not limiting as to the operation and benefits of the current sensor shown in FIGS. 7-10.

EXAMPLE 1

In Example 1, for the purpose of illustration, the following assumptions are made:

1) Saturation voltage of component switches 1 and 2 are about 2 volts.
2) Voltage drops on damper diodes D1 an D2 when clamping are about 0.7 volts.
3) The range of current on shunt resistor 4 is from −20 amps to +20 amps.
4) The resistance of the shunt resistor 4 is 0.01 ohm.

We further assume in this example that the current across the shunt resistor is −20 amps.

$$V_2 - V_C = (U2H - U1H) * \left(\frac{R_f}{R_{in}}\right) \quad (1)$$
$$= (V_A - V_B) * \frac{R_f}{R_{in}}$$
$$= -20\,amp * 0.01\,ohm * \frac{7.5\,k}{1.0\,k}$$
$$= -1.5V$$
$$V_2 - V_1 = (V_2 - V_C) + (V_C - V_1) = -1.5V + 1.5V = 0.0V \quad (2)$$

Since the saturation voltage on switching component 2 is $$V_1 = V_A = 2V \quad (3)$$

We have (4)
$$V_2 = V_1 + 0.0V = 2V$$

$$U2L = V_2 + 0.7V = 2.7V \quad (5)$$
Then
$$U1L = V_1 + 0.7V = 2.7V \quad (6)$$

At last, (7)
$$V(ADC_{in}) - V(ADC\_GND) = V2L - V1L$$
$$= 2.7V - 2.7V$$
$$= 0.0V$$

Where (8)
V(ADC_GND) = 0V.

EXAMPLE 2

In Example 2, for the purpose of illustration, the following assumptions are made:
1) Saturation voltage of component switches 1 and 2 are about 2 volts.
2) Voltage drops on damper diodes D1 an D2 when clamping are about 0.7 volts.
3) The range of current on shunt resistor 4 is from −20 amps to +20 amps.
4) The resistance of the shunt resistor 4 is 0.01 ohm.

We further assume in this example that the current across the shunt resistor is +20 amps.

$$V_2 - V_C = (U2H - U1H) * \left(\frac{R_f}{R_{in}}\right) \quad (9)$$
$$= (V_A - V_B) * \frac{R_f}{R_{in}}$$
$$= +20\,amp * 0.01\,ohm * \frac{7.5\,k}{1.0\,k}$$
$$= 1.5V$$

$$V_2 - V_1 = (V_2 - V_C) + (V_C - V_1) = 1.5V + 1.5V = 3.0V \quad (10)$$

Since the saturation voltage on switch component 2 is $$V_1 = V_A = 2V \quad (11)$$

We have (12)
$V_2 = V_1 + 3V = 5V$ $U2L = V_2 + 0.7V = 5.7V$ (13)

Then
$U1L = V_1 + 0.7V = 2.7V$ (14)

At last, (15)
$V(ADC_{in}) - V(ADC\_GND) = V2L - V1L$
$= 5.7V - 2.7V$
$= 3.0V$

Where (16)
$V(ADC\_GND) = 0V.$

EXAMPLE 3

In Example 3, for the purpose of illustration, the following assumptions are made:
1) Saturation voltage of component switches 1 and 2 are about 2 volts.
2) Voltage drops on damper diodes D1 an D2 when clamping are about 0.7 volts.
3) The range of current on shunt resistor 4 is from −20 amps to +20 amps.
4) The resistance of the shunt resistor 4 is 0.01 ohm.

We further assume in this example that the current across the shunt resistor is 0 amps.

$$V_2 - V_C = (U2H - U1H) * \left(\frac{R_f}{R_{in}}\right) \quad (17)$$
$$= (V_A - V_B) * \frac{R_f}{R_{in}}$$
$$= +0.0\,amp * 0.01\,ohm * \frac{7.5\,k}{1.0\,k}$$
$$= 0.0V$$

$$V_2 - V_1 = (V_2 - V_C) + (V_C - V_1) = 0.0V + 1.5V = 1.5V \quad (18)$$

Since the saturation voltage on switch component 2 is $$V_1 = V_A = 2V \quad (19)$$

We have (20)
$V_2 = V_1 + 1.5V = 3.5V$ $U2L = V_2 + 0.7V = 4.2V$ (21)

Then (22)
$U1L = V_1 + 0.7V = 2.7V$

At last, (23)
$V(ADC_{in}) - V(ADC\_GND) = V2L - V1L$
$= 4.2V - 2.7V$
$= 1.5V$

Where (24)
$V(ADC\_GND) = 0V.$

It is understood that the above description of the various embodiment of the present invention are illustrative and not limiting as to the structures, methods and benefits of the present invention and that various modifications may be made within the scope and spirit of the present invention.

What is claimed is:

1. A current sensor circuit for monitoring current provided to a motor alternately from a first switching component coupled to a high voltage source and a second switching component coupled to a reference voltage, the current sensor circuit providing current sensor signals indicative of the monitored current to related low voltage components, the current sensor circuit comprising:

a shunt resistor having a first side coupled to both the first switching component and the second switching component thereby receiving the current to be measured and a second side coupled to the motor to provide current;

a first clamper diode having a negative terminal disposed to receive a first input signal, U1H, from the first side of the shunt resistor, and having a positive terminal disposed to provide a first output signal, U1L, related to said first input signal, U1H;

a second clamper diode having a negative terminal disposed to receive a second input signal, U2H, from the second side of the shunt resistor, and having a positive terminal disposed to provide a second output signal, U2L, related to said second input signal, U2H;

wherein the first clamper diode and the second clamper diode have equal values thereby causing said first and second input signals, U1H and U2H to be generally related to said first and second output signals, U1L and U2L, by the equation:

U1L−U2L=U1H−U2H.

2. The current sensor circuit from claim 1 further comprising a pair of capacitors connected to the positive terminal of the first clamper diode and the positive terminal of the second clamper diode respectively, for suppressing transient noise from the negative terminals of said first and second clamper diodes caused by parasitic capacitance on said diodes, the pair of capacitors having equal capacitance thereby maintaining the relationship of U1L−U2L to (U1H−U2H.

3. The current sensor circuit from claim 2 wherein the opposite ends of the pair of capacitors are connected to a circuit ground.

4. The current sensor circuit from claim 2 wherein said positive electrode of said first clamper diode is connected to a first low power resistor and said positive electrode of said second clamper diode is connected to a second low power resistor.

5. The current sensor circuit from claim 4 wherein said first low power resistor and said second low power resistor have equal parameters.

6. The current sensor circuit from claim 4 further comprising one or more capacitors connected between said positive electrode of said first clamper diode and said positive electrode of said second clamper diode.

7. The current sensor circuit from claim 4 wherein an opposing end of said first and second low power resistors are connected to a low voltage power source for clamping.

8. The current sensor circuit from claim 1 further comprising a differential amplifier circuit disposed to receive said first output signal, U1L, from said positive terminal of first clamper diode and said second output signal, U2L, from said positive terminal of said second clamper diode.

9. The current sensor circuit of claim 8 wherein the differential amplifier provides a reference voltage to an A/D converter, wherein the reference voltage has a magnitude that is half of A/D converter input range, the differential amplifier further providing a measurement voltage output having a magnitude within the A/D converter input range.

10. The current sensor circuit of claim 9 wherein the A/D converter is contained within a digital control and measurement unit.

11. The current sensor circuit of claim 1 wherein the voltage difference between the high voltage source and the reference voltage is greater than 150 volts.

12. The current sensor circuit of claim 1 wherein the low voltage components operate at voltage levels less than 15 volts.

13. A current sensor circuit for monitoring current provided to a motor alternately from a first switching component coupled to a high voltage source and a second switching component coupled to a reference voltage, the current sensor providing related current sensor signals indicative of the monitored current to a control circuit coupled thereto, the current sensor circuit comprising:
  a signal transfer unit having a first clamper diode for receiving a first input signal, U1H, from a first side of a shunt resistor attached to the first switching component and the second switching component to thereby receive the current being provided to the motor, the signal transfer unit further having a second clamper diode for receiving a second input signal, U2H, from a second side of the shunt resistor, wherein said first and second clamper diodes have substantially equal parameters;
  a signal conditioner unit having a differential amplifier disposed to receive a first signal, U1L, from said first clamper diode and a second signal, U2L, from said second clamper diode and to provide a reference voltage output, V1, and a measurement voltage output, V2, each having a magnitude and change falling within one or more operating parameters of the cooperating control circuit coupled thereto.

14. The current sensor circuit of claim 13 wherein the voltage difference between the high voltage source and the reference voltage is greater than 150 volts.

15. The current sensor circuit of claim 13 wherein the control circuit operates at voltage levels less than 15 volts.

16. A current sensor circuit for monitoring current provided from a switch mode power supply, the current sensor circuit comprising:
  a shunt resistor attached to the switch mode power supply to receive the current to be measured;
  a first clamper diode having a first terminal coupled to a first side of the shunt resistor to receive a first high voltage input signal, U1H, and having a second terminal disposed to provide a first output signal, U1L, related to said first input signal, U1H;
  a second clamper diode having a first terminal coupled to a second side of the shunt resistor to receive a second high voltage input signal, U2H, and having a second terminal disposed to provide a second output signal, U2L, related to said second input signal, U2H;
  a pair of capacitors connected to the positive terminal of the first clamper diode and the second clamper diode respectively, for suppressing transient noise from the negative terminals of said first and second clamper diodes caused by parasitic capacitance;
  wherein the positive electrode of the first clamper diode is connected to a first low power resistor and the second clamper diode is connected to a second low power resistor, wherein said first resistor and said second resistor have equal parameters; and
  at least one capacitors having its two ends connected between the positive electrode of the first clamper diode and the positive electrode of the second clamper diode;
  wherein the difference between the first and second input signals, U1H and U2H, is equal to the difference between the said first and second output signals, U1L and U2L.

* * * * *